United States Patent [19]

Birt

[11] 4,162,455

[45] Jul. 24, 1979

[54] AMPLIFIER SYSTEMS

[75] Inventor: David R. Birt, Charlwood, England

[73] Assignee: Communications Patents Limited, London, England

[21] Appl. No.: 866,816

[22] Filed: Jan. 4, 1978

[30] Foreign Application Priority Data

Jan. 7, 1977 [GB] United Kingdom ............... 476/77

[51] Int. Cl.² .............................................. H03F 3/38
[52] U.S. Cl. ................................ 330/10; 330/207 A; 330/251; 332/41
[58] Field of Search .................... 330/10, 207 A, 251; 332/41; 325/156, 157; 328/62

[56] References Cited

U.S. PATENT DOCUMENTS

| 3,336,538 | 8/1967 | Crowhurst | 330/207 A |
| 3,579,132 | 5/1971 | Ross | 330/251 |
| 3,585,517 | 6/1971 | Herbert | 330/10 |
| 3,648,186 | 3/1972 | Kahn | 330/10 |
| 3,740,660 | 6/1973 | Davies | 328/62 X |

Primary Examiner—James B. Mullins
Attorney, Agent, or Firm—Laurence R. Brown

[57] ABSTRACT

This invention relates to an amplifier system comprising two or more Class D amplifiers the outputs of which are associated with a common system output in a known manner. To avoid the appearance of spurious sidebands in the system output which are associated with the switching process of the amplifiers, separate clock pulse trains are applied to the Class D amplifiers, the separate clock pulse trains being interlaced to obtain cancellation of switching frequency ripple at the common system output.

5 Claims, 8 Drawing Figures

AMPLIFIER SYSTEMS

The present invention relates to amplifier systems, and in particular to amplifier systems incorporating two or more pulse width modulated (Class D) amplifiers.

Amplifier systems incorporating two or more Class D amplifiers are used for example in transmitter systems to amplitude modulate radio frequency amplifiers the outputs of which are combined. The outputs of the Class D amplifiers carry unwanted signal components associated with the switching process of the amplifiers, which signal components result in spurious sidebands appearing in the transmitter output. Conventionally the spurious sidebands have been removed by filters, but it has been found that conventional filtering is relatively unsuccessful.

It is an object of the present invention to obviate or mitigate the above problem.

According to the present invention, there is provided an amplifier system comprising two or more Class D amplifiers the outputs of which are associated with a common system output, and switching frequency generating means for providing separate clock pulse trains to the or at least two of the Class D amplifiers, the said separate clock pulse trains being interlaced to obtain concellation of switching frequency ripple at the common system output.

The outputs of the Class D amplifiers may for example amplitude modulate respective radio frequency amplifiers the outputs of which are combined for transmission. Where two Class D amplifiers are provided, the clock pulse trains are symmetrically interlaced.

An embodiment of the present invention will now be described, by way of example, with reference to the accompanying drawings, in which.

Figure 1:
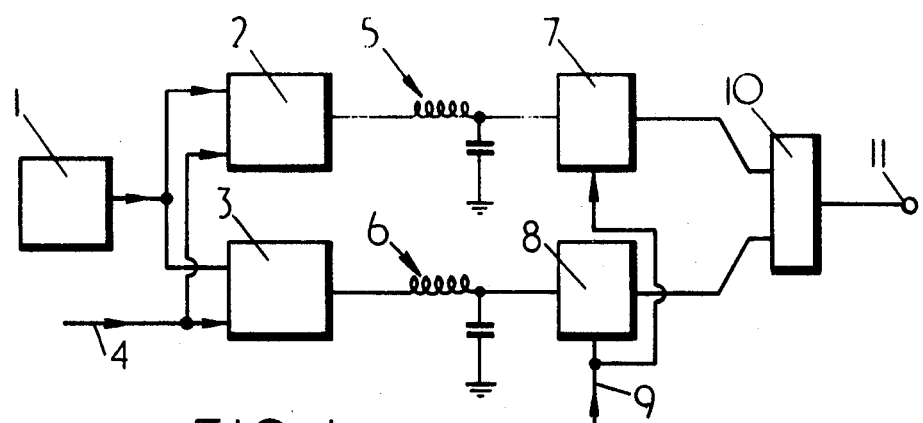
FIG. 1 illustrates a conventional transmitter.

Referring to FIG. 1, the conventional transmitter illustrated comprise a switching frequency generator 1 providing a single clock pulse train which is applied to each of two Class D amplifiers 2 and 3. The amplifiers also receive a common control input 4.

The outputs of the amplifiers 2, 3 comprise pulse width modulated signals which are passed via respective inductive/capacitive low pass filters 5, 6 to radio frequency amplifiers 7, 8 are which also receive a common R.F. input 9. The amplifiers 7, 8 are amplitude modulated by the Class D amplifiers 2, 3 and provide modulated RF outputs to a combining network 10. The combined modulated RF output 11 of the network 10 is transmitted. The outputs of the amplifiers 2, 3 are thus associated with the common system output 11.

In practice, low amplitude residual switching frequency waveforms appear at the outputs of the filters 5, 6. As the amplifiers 2, 3 are driven in parallel by a common output of the switching frequency generator 1, the residual switching frequency waveforms at the outputs of the filters 5, 6 are substantially identical in amplitude and phase. The influences of the residual switching frequency waveforms on the combined output 11 are therefore additive, and result in spurious sidebands appearing which cause operational problems.

Figure 2:
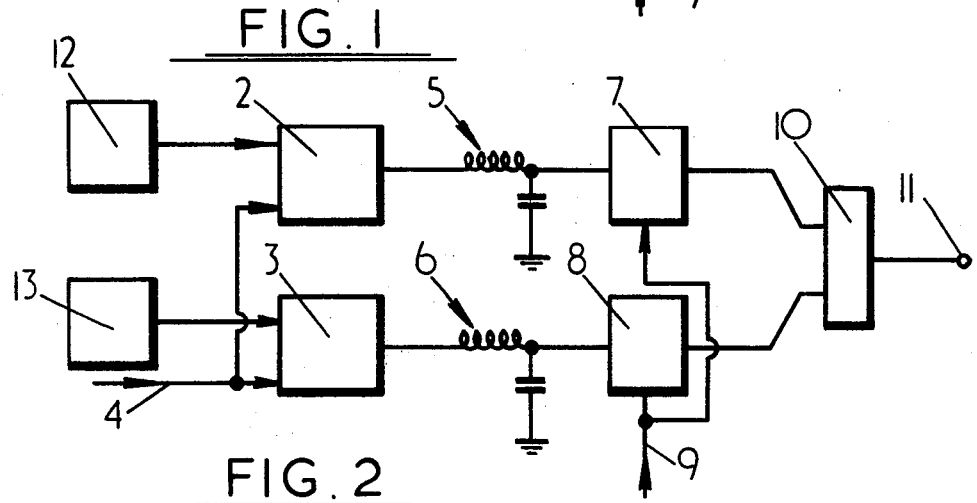
FIG. 2 illustrates a transmitter according to the present invention.

FIG. 2 illustrates a transmitter according to the invention. Components common to FIGS. 1 and 2 are given the same reference numerals.

Figure 3A:
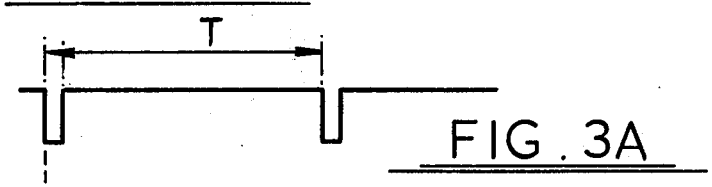
FIGS. 3A and 3B show clock pulse waveforms generated in the transmitter of FIG. 2.
Figure 3B:
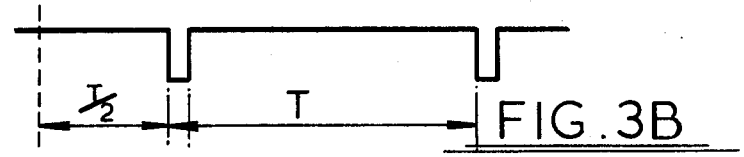

The only difference between the transmitter of FIGS. 1 and 2 resides in the replacement of the single switching frequency generator 1 by a switching frequency generating means incoporating two generators 12, 13 which provide separate clock pulse outputs to the amplifiers 2, 3. The output waveforms of the generators 12, 13 are shown in FIGS. 3A and 3B respectively. It will be seen that the two output waveforms are symmetrically interlaced, the interrelationship being maintained at all times.

Figure 4A:
FIGS. 4A and 4B show residual ripple waveforms appearing in transmitter of FIG. 2.
Figure 4B:

The operation of the FIG. 2 transmitter is the same as that of FIG. 1 except for the fact that the residual switching frequency ripples at the outputs of filters 5, 6 are mutually cancelling, the ripple waveforms being shown in FIGS. 4A and 4B respectively. The combined output 11 will thus be free from unwanted switching frequency components.

Figure 5:
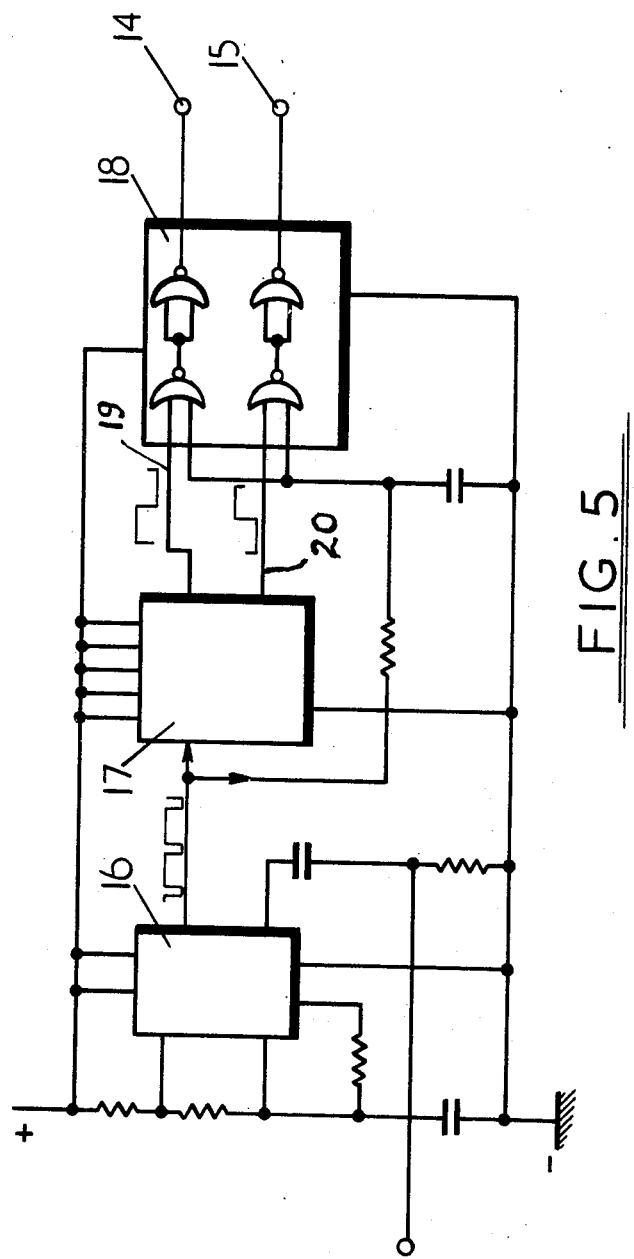
FIG. 5 shows circuit details of an interlaced clock pulse generator suitable for use in the transmitter of FIG. 2.

Referring now to FIG. 5, the illustrated circuit corresponds to both of the generators 12 and 13 of FIG. 2, providing outputs at terminals 14 and 15 which are connected to the amplifiers 2 and 3 respectively of FIG. 2.

The circuit comprises a timer 16 operating as a free-running astable multivibrator to provide a rectangular wave signal to a clocked flip-flop binary divider 17 and a quad two input NOR gate circuit 18. The divider 17 provides symmetrical square wave signals on lines 19 and 20 to the gate 18. The gate circuit 18 produces the interlaced clock pulse signals shown in FIGS. 3A and 3B.

Figure 6:
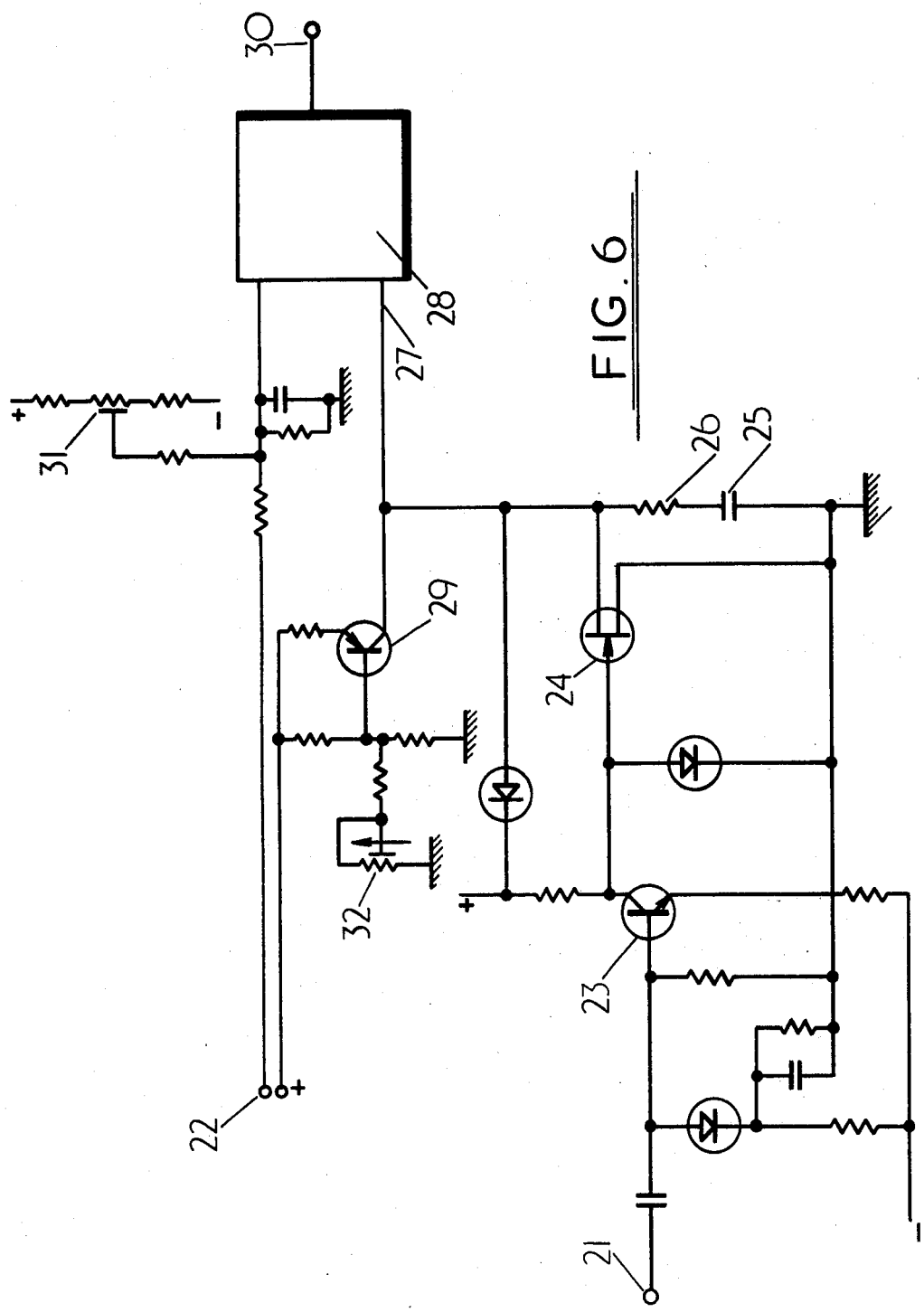
FIG. 6 shows circuit details of a class D amplifier suitable for use in the transmitter of FIG. 2.

Referring now to FIG. 6, the basic circuitry of the amplifier 2 of FIG. 2 is illustrated. In practice each amplifier 2, 3 would include additional circuitry to provide improved performance, for example linearity correction circuitry and limiting circuitry, but the circuitry illustrated in FIG. 6 is sufficient to provide the required pulse width modulated signals to the radio frequency amplifiers 7 of FIG. 2.

The output 14 of the generator of FIG. 5 is applied to an input 21 (FIG. 6), and the control input 4 (FIG. 2) is applied to input 22. Each negative going pulse at input 21 renders a transistor 23 non-conductive which in turn renders a transistor 24 conductive to discharge a capacitor 25 through a low ohmic value resistor 26. The potential appearing at input 27 to a comparator 28 is thus reduced to zero. Thereafter the capacitor 25 is charged by current passing through a transistor 29 and a ramp waveform accordingly appears at input 27. The comparator provides an output at 30 which comprises pulses the width of which corresponds to the time taken for the ramp voltage at input 27 to each the level of the control input applied to input 22.

An input offset circuit including potentiometer 31 and a gain adjustment circuit including potentiometer 32 are also provided.

Although for the purposes of explanation, a system incorporating only two Class D amplifiers has been described, a system incorporating n Class D amplifiers, n modulators and n clock pulse generators could be provided. Such a system would enable suppression of harmonics of the switching frequency.

What is claimed is:

1. An amplifier system comprising at least two Class D amplifiers the outputs of which drive a common system output to provide modulated RF output signals, switching frequency generating means for providing separate clock pulse trains to said at least two Class D amplifiers, and means interlacing the said separate clock pulse trains to obtain cancellation of switching frequency ripple at the common system output thereby modulating said RF output signals to produce a modulated carrier.

2. An amplifier system according to claim 1, wherein two Class D amplifiers are provided and the clock pulse trains applied thereto are symmetrically interlaced.

3. An amplifier system according to claim 1, wherein the common system output consists of means connecting the outputs of the Class D amplifiers to respective radio frequency amplifiers so as to amplitude modulate the outputs thereof, and means combining the outputs of the radio frequency amplifiers for transmission.

4. An amplifier system according to claim 1, wherein the switching frequency generating means comprises a multivibrator the output of which is applied to a clocked flip-flop binary divider, the binary divider providing symmetrical square wave output signals to a gate circuit.

5. An amplifier system according to claim 1, wherein each Class D amplifier comprises a ramp generator the output of which is applied to a comparator, the comparator being connected to receive a control input and to provide pulse width modulated output signals the widths of the pulses of which are determined by the time taken for the ramp generator output to reach the level of the control input.

* * * * *